(12) United States Patent
Suga et al.

(10) Patent No.: US 7,075,159 B2
(45) Date of Patent: Jul. 11, 2006

(54) HORIZONTAL MOS TRANSISTOR

(75) Inventors: Shinichiro Suga, Kasugai (JP); Takumi Kawai, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/911,630

(22) Filed: Aug. 5, 2004

(65) Prior Publication Data
US 2005/0212012 A1 Sep. 29, 2005

(30) Foreign Application Priority Data
Mar. 24, 2004 (JP) .............................. 2004-085937

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ...................... 257/390; 257/208
(58) Field of Classification Search ................ 257/208, 257/209, 210, 390
See application file for complete search history.

(56) References Cited

U.S. PATENT DOCUMENTS 5,239,196 A * 8/1993 Ikeda et al. ................. 257/385
6,522,004 B1 * 2/2003 Higuchi ...................... 257/758
2002/0024856 A1 * 2/2002 Kumagai et al. ........... 365/200

FOREIGN PATENT DOCUMENTS

JP 09-129867 5/1997

* cited by examiner

*Primary Examiner*—Ngân V. Ngô
(74) *Attorney, Agent, or Firm*—Westerman, Hattori, Daniels & Adrian, LLP (57) ABSTRACT

This invention provides a horizontal MOS transistor capable of improving current drivability and reducing ON resistance by optimizing the gate wiring structure and the disposition structure of source/drain layers. First gate wirings are disposed in the X direction at a pitch Y1 in the Y direction and second gate wirings 12 are disposed in the Y direction with two pieces as a pair such that they meander at a pitch X1 in the X direction. The meandering of the second gate wiring 12 is formed so as to sandwich the bent portions 14 substantially in the center of the pitch Y1. A bottle-like shape diffusion layer region in which the wide-width region and narrow-width region are combined is sectioned by adjacent first and second wirings. A contact 16 for connecting the diffusion layer region to the wiring layer 18 is disposed in the wide-width region and wiring layers 18 are disposed such that two rows run in parallel in the X direction. A diffusion layer region is a different electrode region from diffusion layer regions adjacent on four sides thereby forming a MOS transistor. Consequently, a horizontal MOS transistor excellent in current drivability for each unit region and having a slight ON resistance is constructed.

20 Claims, 7 Drawing Sheets

PARTIAL PLAN VIEW OF HORIZONTAL MOS TRANSISTOR DIRECTED TO EMBODIMENT

FIG.1 PARTIAL PLAN VIEW OF HORIZONTAL MOS TRANSISTOR DIRECTED TO EMBODIMENT

FIG.2  SECTIONAL VIEW OF SECTION A-A IN FIG.1

FIG.3  SECTIONAL VIEW OF SECTION B-B IN FIG.1

FIG.4  SECTIONAL VIEW OF SECTION C-C IN FIG.1

FIG.5

FIG.6 PARTIAL PLAN VIEW OF COMPARISON PATTERN (2)

FIG.7 PARTIAL PLAN VIEW OF COMPARISON PATTERN (3)

FIG.8 PARTIAL PLAN VIEW OF COMPARISON PATTERN DIRECTED TO EMBODIMENT

FIG.9    PRIOR ART

PARTIAL PLAN VIEW OF CONVENTIONAL
HORIZONTAL MOS TRANSISTOR

HORIZONTAL MOS TRANSISTOR

CROSS-REFERENCE TO RELATED APPLICATIONS

This application is based upon and claims the benefit of priority from each of the prior Japanese Patent Application No. 2004-085937 filed on Mar. 24, 2004, the entire contents of which are incorporated herein by reference.

BACKGROUND OF THE INVENTION

1. Field of the Invention

The present invention relates to layout structure of a MOS transistor, and more particularly to layout structure of a horizontal MOS transistor.

2. Description of Related Art

Figure 9:
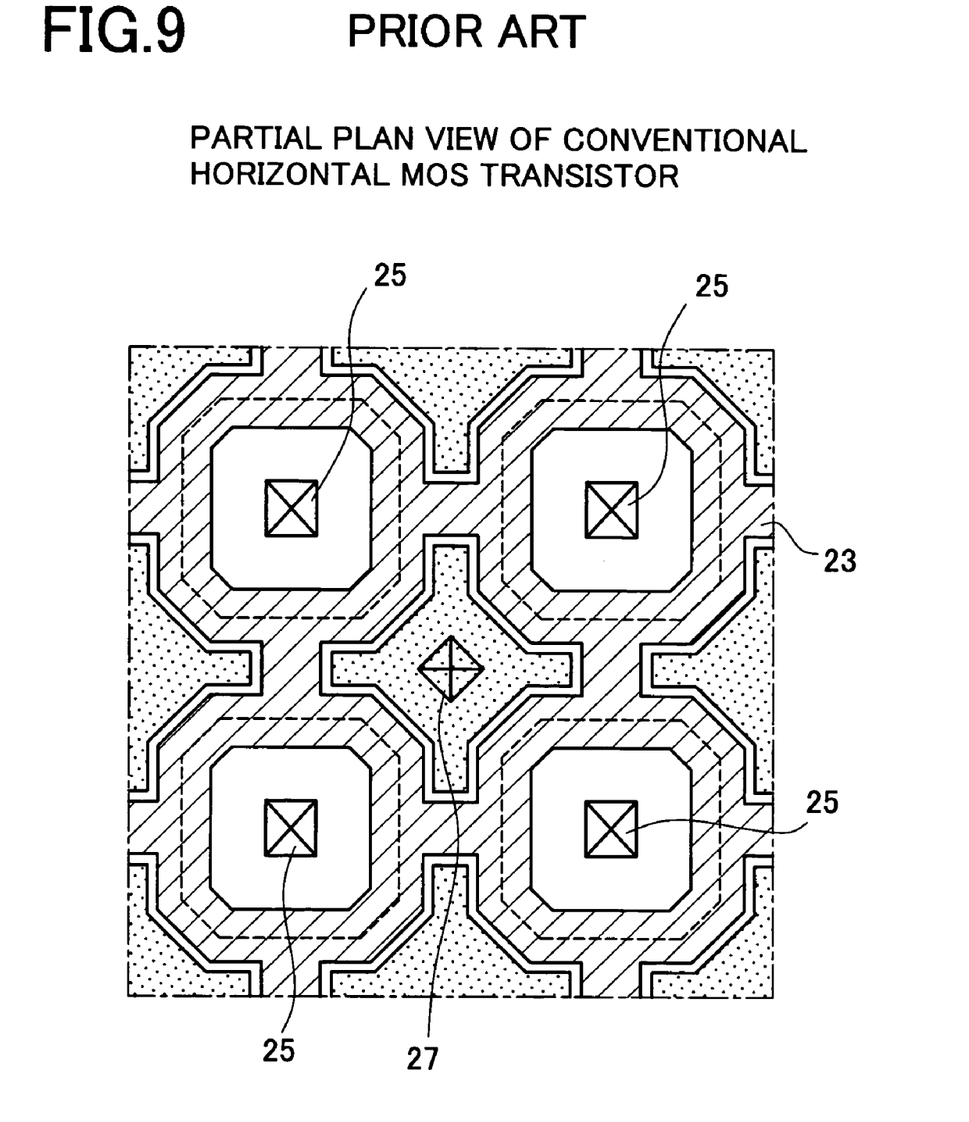
FIG. 9 is a partial plan view of a conventional horizontal MOS transistor.

A semiconductor device disclosed in JP Laid-open Patent publication No. 9-129867 intends to reduce ON resistance by shortening a distance between source contacts with respect to a horizontal DSA (Double-diffused Self Alignment system) power MOSFET. As shown in FIG. 9, unit cells of the semiconductor device is structured such that a drain contact 27 is arranged in a rectangular region surrounded by adjoining four source contacts 25 each of which is surrounded by gate layer 23 and periphery of the rectangular region is surrounded by gate layer 23. The drain contact 27 has four sizes parallel to diagonal lines of the rectangular region and is arranged facing source contacts 25 or arranged on the diagonal lines so that ON resistance can be reduced due to shortened distance between two contacts.

SUMMARY OF THE INVENTION

In JP Laid-open Patent publication No. 9-129867, a distance between a source contact and a drain contact in diagonal-line direction of a rectangular region surrounded by adjoining source contacts is shortened and ON resistance is reduced, actually.

However, as a matter of fact, drain contacts are arranged to face one another sandwiching gate layer which constitutes each side of the rectangular region. Furthermore, source contacts are arranged to face one another along with gate layer which constitutes the rectangular region. It never works as MOS transistor in a region of MOS transistor structure where drain contacts face one another and source contacts face one another. Unit cells including MOS transistor structure inoperable as MOS transistor restricts its current drivability and ON resistance, which is problematic.

The present invention has been made to resolve the above- described problems. Accordingly, it is an object of the present invention to provide a horizontal MOS transistor capable of enhancing current drivability and reducing ON resistance by optimizing wiring structure of gate layer and layout structure of source-drain regions.

According to one aspect of the present invention, there is provided a horizontal MOS transistor structured such that first gate wirings wired in a first direction and second gate wirings wired in a second direction are arranged on same wiring layer and the fist gate wirings arranged by first predetermined pitch and pairs of the second gate wirings arranged by second predetermined pitch constitute mesh structure. Furthermore, the second gate wirings has bend sections between adjoining two of the first gate wirings and meander by the first predetermined pitch.

Thereby, in the mesh structure constituted by the first gate wirings and the second gate wirings crossing one another, MOS transistors are constituted in four directions sandwiching the mesh structured gate wirings. Therefore, nevertheless a gate width per unit area can be made wider, regions of same electric field such as source layer or drain layer exist only at diagonal position and regions of same electric field never face one another sandwiching gate wirings. Therefore, MOS transistor structure of not-for transistor operation can be minimized. Furthermore, since second gate wirings are wired in second direction meanderingly, gate width per unit length can be widened.

According to the present invention, while MOS transistor structure of not-for transistor operation can be minimized, gate width per unit width and per unit area can be widened. Thereby, there can be provided a horizontal MOS transistor such that an effective transistor region per unit region can be enlarged, current drivability per unit region is excellent, and ON resistance is very little.

The above novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, the preferred embodiments of the horizontal MOS transistor of the present invention will be described in detail with reference to FIGS. 1–8.

Figure 1:
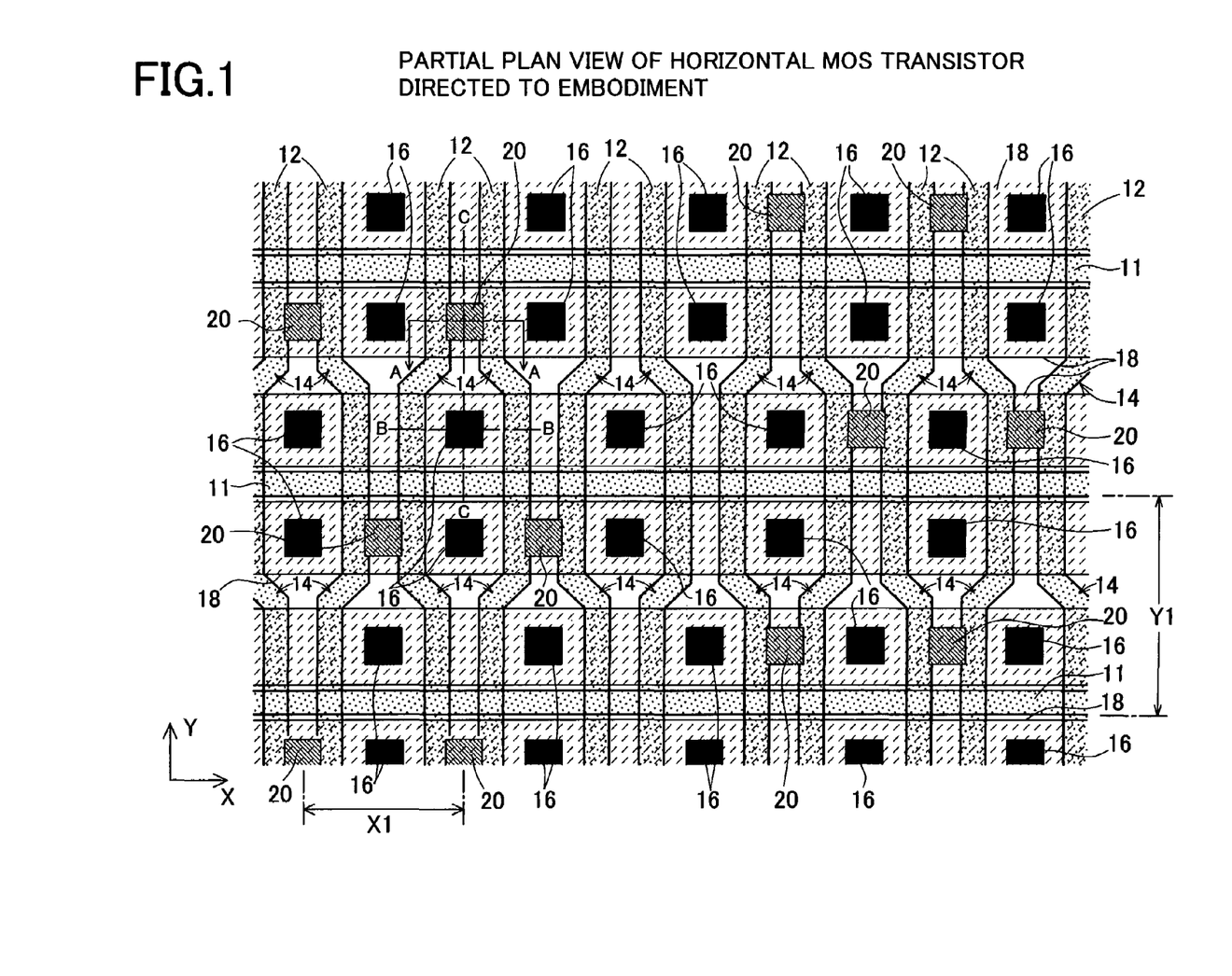
FIG. 1 is partial plan view of a horizontal MOS transistor directed to an embodiment.
Figure 2:
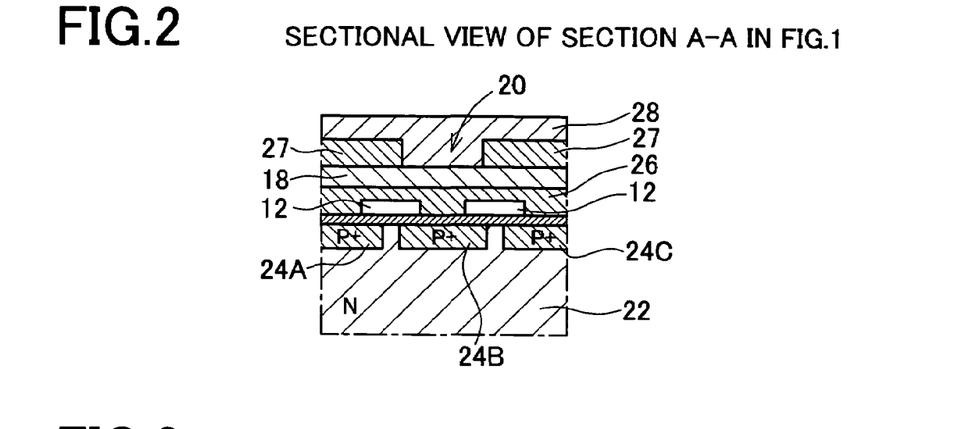
FIG. 2 is a sectional view of section A—A in FIG. 1.
Figure 3:
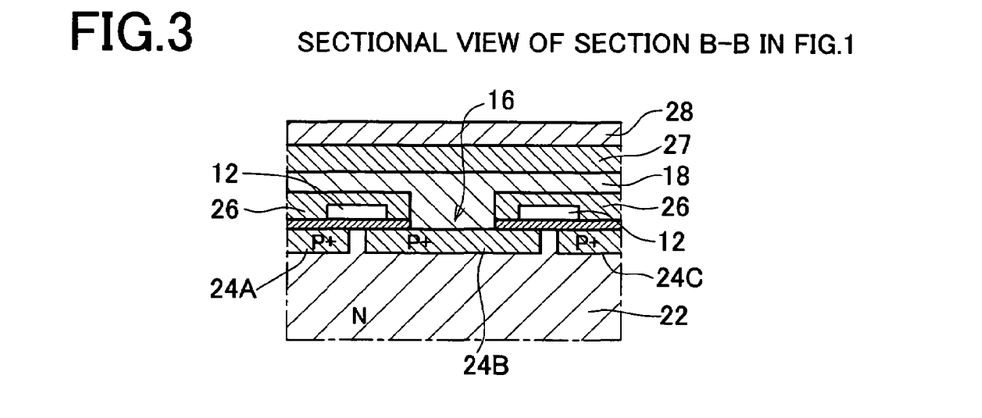
FIG. 3 is a sectional view of section B—B in FIG. 1.
Figure 4:
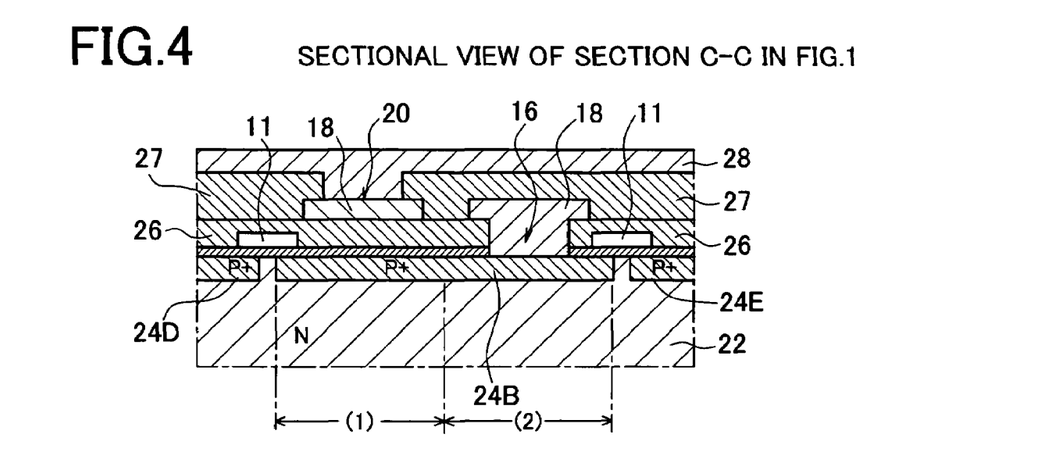
FIG. 4 is a sectional view of section C—C in FIG. 1.

FIG. 1 shows the layout of the horizontal MOS transistor of this embodiment and FIGS. 2–4 show sectional views taken along the lines A—A to C—C shown in FIG. 1. The horizontal MOS transistor of this embodiment is a transistor of output stage incorporated in a control IC for controlling the power of a switching power supply and the like.

As shown in FIGS. 2–4, P-type diffusion layers 24A–24E are formed as source/drain layers in the surface portion of an N-type substrate 22 which is a base of a chip constituting a control IC or in the surface portion of the N-type well layer 22 constructed in the form of a semiconductor substrate so as to form a PMOS transistor.

Although FIGS. 2–4 exemplify the PMOS transistor, the NMOS transistor can be constructed in the same manner. The reason is that a difference between the P conductive type and N conductive type is determined depending on the sectional longitudinal structures shown in FIGS. 2–4, so that the layout structure shown in FIG. 1 can be applied regardless of the difference between the P conductive type and N conductive type.

The layout structure will be described with reference to FIG. 1. Along an X direction in this Figure, a first gate wiring 11 is disposed with a pitch Y1 in the Y direction. Further along the Y direction, two second gate wirings 12 are disposed as a pair with a pitch X1 in the X direction. The first and second gate wirings 11, 12 form a gate electrode of the MOS transistor having a mesh structure formed of the same wiring layers. The wiring layer mentioned here is a polycrystalline silicone layer for example. Because the first gate wiring 11 is disposed linearly in the X direction without being bent, the first gate wiring 11 is disposed with the shortest route in the X direction. Gate resistance is reduced by the wiring route on the first gate wiring 11 and the wiring route up to the second gate wiring 12 branched from the first gate wiring 11. A region surrounded by the first and second gate wirings 11, 12 is a diffusion layer region, which constitutes electrode regions such as source layer and drain layer.

The second gate wiring 12 has a bent section 14 which is bent obliquely substantially in the center of a pitch Y1 of the first gate wiring 11. In the diffusion layer region sandwiched by the first gate wiring 11 and the second gate wiring 12, the bent sections 14 of the second gate wirings 12 are bent in opposite directions having a relation of mirror symmetry, so that the region surrounded by the second gate wirings 12 is formed in the shape of a bottle consisted of a wide-width region in which the width is large and a narrow-width region in which the width is narrowed.

Because the adjacent second gate wirings 12 are in the relation of mirror symmetry, the bottle-like shaped diffusion layer region constituted of the wide-width region and narrow-width region is disposed in the X direction with the disposition direction in the Y direction inverted alternately. Because the second gate wiring 12 intersects the first gate wiring 11 at right angle, the diffusion layer regions located adjacent oppose each other in each direction of the X and Y directions.

A contact 16 for connecting the diffusion layer region to a wiring layer 18 composed of a metal layer and the like is disposed in the wide-width region in the bottle-like shaped diffusion layer region. In this case, because the bottle-shapes of the diffusion layer regions invert alternately along the X direction, two wide-width regions are arranged alternately along the X direction within a Y-direction pitch Y1. Consequently, the contacts 16 in the wide-width region are arranged in two rows and the wiring layers 18 are arranged in the X direction along the two rows of the contacts 16. The two wiring layers 18 disposed within the pitch Y1 are connected to the diffusion layer region disposed in the X direction alternately thereby each constructing a source layer and a drain layer.

A wire picked up by the wiring layer 18 as the source layer and drain layer of each Y-direction pitch Y1 is connected to an upper wiring layer 28 (see FIGS. 2–4) through a upper contact 20. The upper wiring layer 28 is composed of for example, a metal layer and in this case, the upper contact 20 is a so-called via contact. When the MOS transistor shown in FIG. 1 controls the switching of a large current, preferably, wiring resistance in a current route from the source layer and the drain layer is reduced as much as possible. Thus, the upper wiring layer 28 is constructed having a wide wiring width on the upper layer of the MOS transistor structure. Further, it can be considered that this is constructed in the form of a plane shape having two-dimensional expanding.

Because the upper contact 20 for connecting the wiring layer 18 to the upper wiring layer 28 is located above the gate wirings 11, 12, it can be disposed just above the gate wirings 11, 12. Referring to FIG. 1, the upper contact 20 is disposed in the narrow-width region in the diffusion layer region. The frequency of the disposition can be determined considering the connecting resistance between the wiring layer 18 and the upper wiring layer 28.

A diffusion layer region and two diffusion layer regions adjacent in each of the X and Y directions on four sides constitute a different electrode region, so that the source and drain layers are formed across the gate wirings 11, 12 on the four sides which section a single diffusion layer region so as to construct a MOS transistor.

Because a mesh structured gate wiring configuration is possessed by the first and second gate wirings 11, 12 and MOS transistors are constructed on four sides of the mesh structure, the gate width of each unit area in the MOS transistor layout can be increased. Further, because the second gate wiring 12 meanders in the Y direction, the gate width per unit length in the Y direction can be expanded.

Because the diffusion layer regions of different electrodes of the source layer and drain layer oppose each other in the X and Y directions and the diffusion layer regions oppose each other in each of the X and Y directions, the diffusion layer regions of the same pole oppose only in the diagonal direction like source layer to source layer or drain layer to drain layer. A region in which the gate wirings 11, 12 intersect each other surrounded by the diffusion layer regions in the diagonal direction turns to a non-active region which does not contributes to the operation of a transistor. This non-active region can be reduced to its minimum area because the first gate wiring 11 and the second gate wiring 12 intersect each other at right angle.

Consequently, expansion of an effective gate width can be achieved with the minimum area of the non-active region so that the structure of the MOS transistor which performs a transistor operation effectively in each unit region can be increased. As a result, the horizontal MOS transistor excellent in a current drivability in each unit area and having a low ON resistance can be constructed.

FIGS. 2–4 are sectional views taken the lines A—A to C—C shown in FIG. 1. The sectional view taken the line A—A (FIG. 2) is a sectional view of the narrow-width region. With a P-type diffusion layer region 24B in the narrow-width region as a common diffusion layer region, the gate wirings 12 are provided at both end portions in the X direction and constructs the MOS transistor together with the adjacent P-type diffusion layer regions 24A, 24C. The P-type diffusion layer region 24B sandwiched by the gate wirings 12 is a narrow-width region, which has no sufficient width for disposing the contact 16 for connecting the wiring layer 18 and thus, the upper contact 20 is disposed instead of the contact 16 and the wiring layer 18 is connected to the upper wiring layer 28. In the meantime, reference numerals 26, 27 denote interlayer insulating film.

The sectional view taken along the line B—B is a sectional view of the wide-width region. With the P-type diffusion layer region 24B located in the wide-width region as a common diffusion layer region, the gate wiring 12 is provided on both end portions in the X direction and constructs a MOS transistor together with the adjacent P-type diffusion layer regions 24A, 24C. The P-type diffusion layer region 24B surrounded by the gate wirings 12 has a sufficient width and the contact 16 is disposed therein so that the P-type diffusion layer 24B and the wiring layer 18 are connected. In the meantime, the reference numerals 26, 27 in FIG. 3 denote an interlayer insulating film.

The sectional view taken the line C—C (FIG. 4) is a sectional view of the bottle-like shaped diffusion layer region. The P type diffusion layer region 24B is divided to two sections across the center thereof, the narrow-width region (FIG. 4(1)) and the wide-width region (FIG. 4(2)). The upper contact 20 is disposed in the narrow-width region and the contact 16 in the wide-width region. In the meantime, the reference numerals 26, 27 in FIG. 4 denote an interlayer insulating film.

Figure 5:
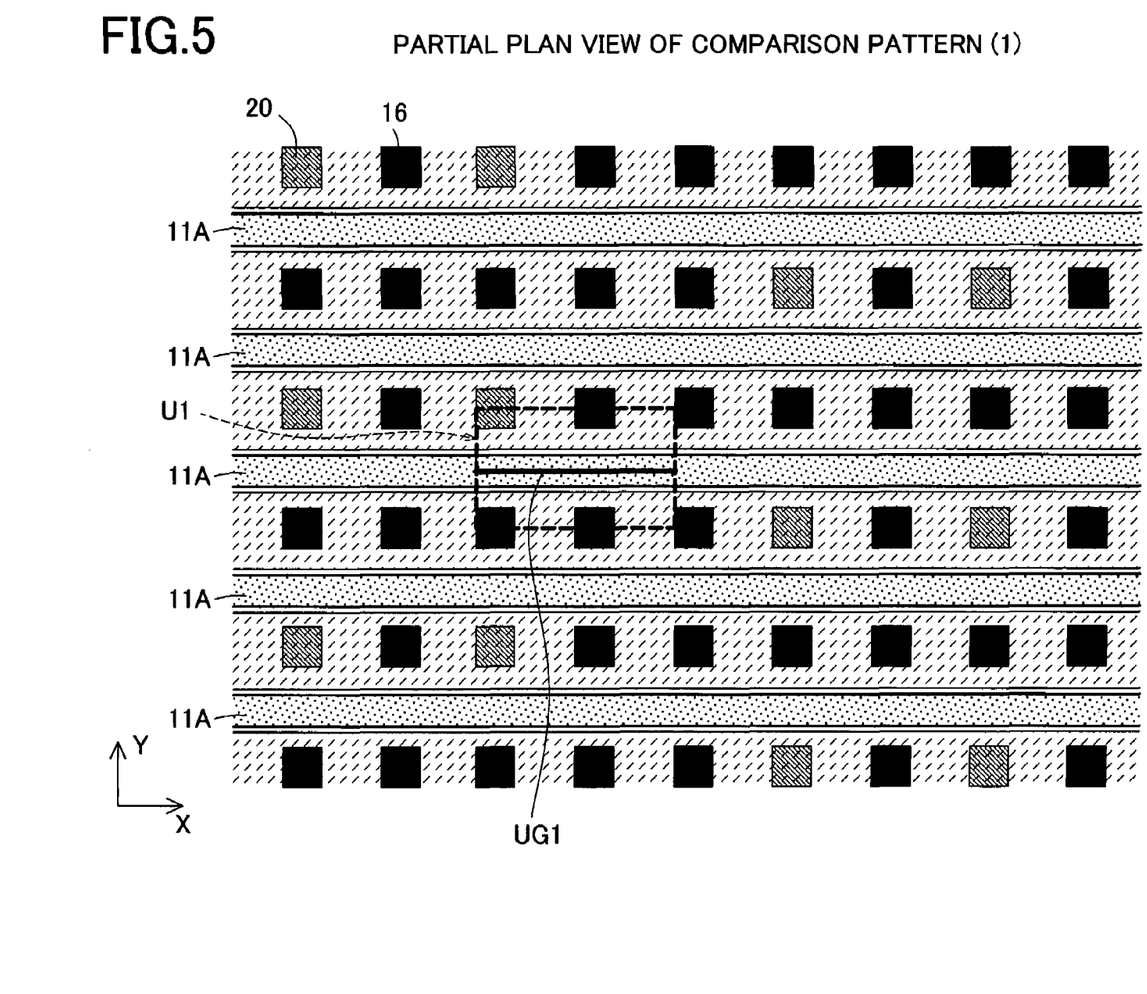
FIG. 5 is a partial plan view of comparison pattern (1)
Figure 6:
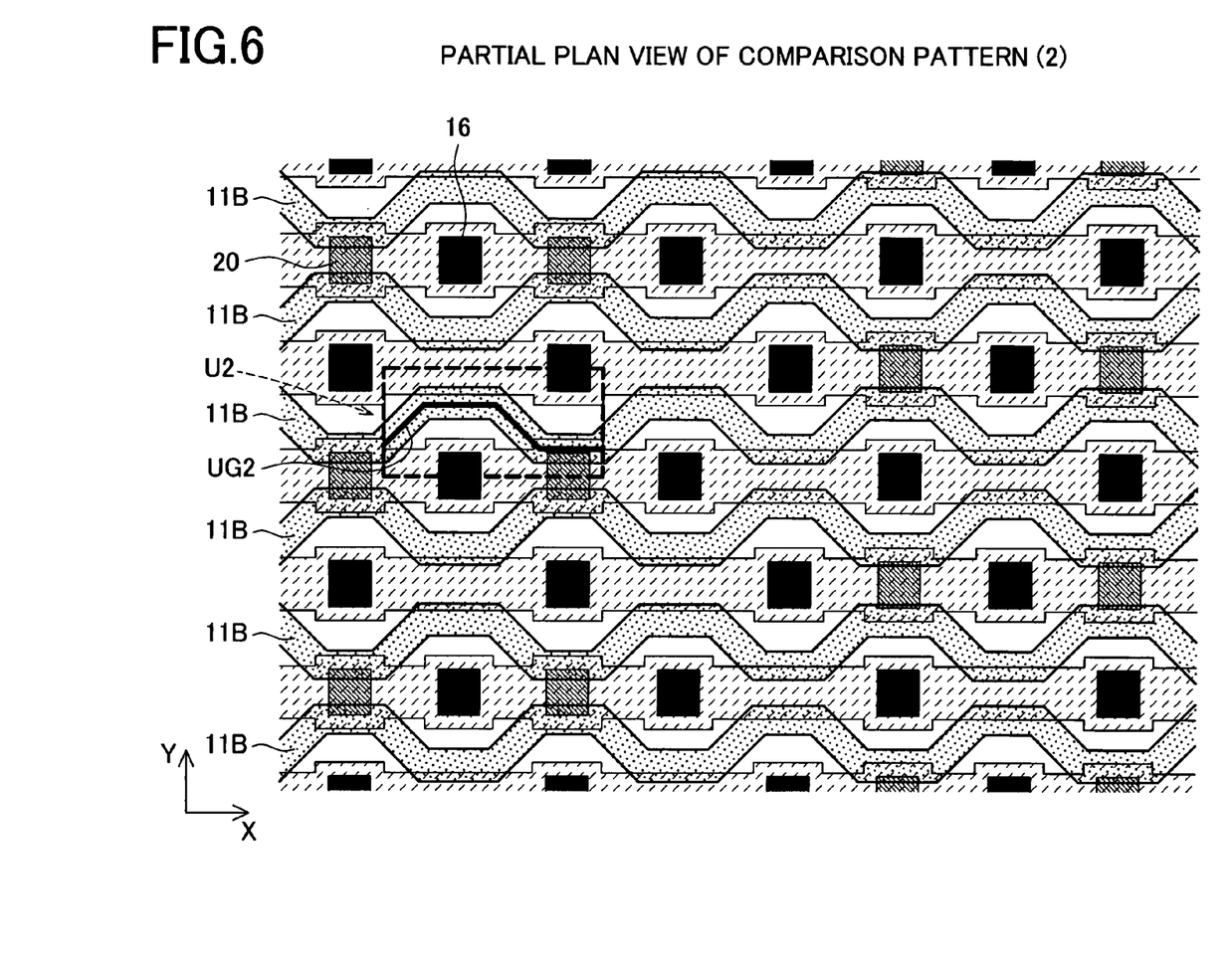
FIG. 6 is a partial plan view of comparison pattern (2)
Figure 7:
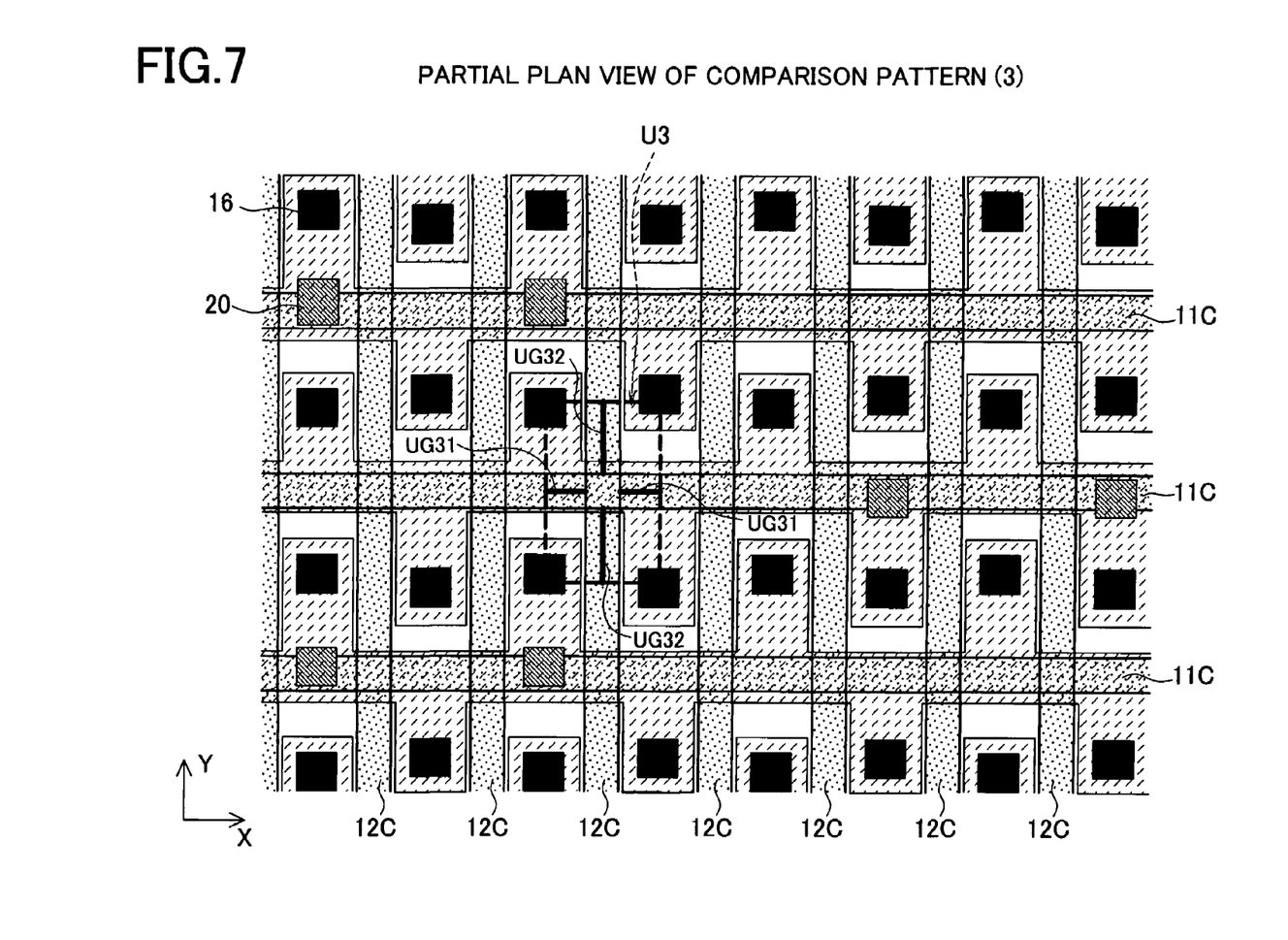
FIG. 7 is a partial plan view of comparison pattern (3)

As for the layout pattern of the embodiments, the gate width n and the ON resistance RON per unit area will be compared between comparison patterns (1)–(3) shown in FIGS. 5–7. Upon this comparison, the comparison pattern (1) in FIG. 5 is used as a reference pattern, and the gate width n and ON resistance RON per each unit area on the comparison pattern (1) standardize the layout pattern of the embodiments.

The comparison pattern (1) of FIG. 5 which is the reference pattern is a stripe pattern in which the gate wirings 11A placed linearly in the X direction are disposed at a constant pitch in the Y direction. This is the most basic layout for constructing the MOS transistor. The basic unit U1 contains a gate wiring 11A, which has a 1-pitch width in the Y direction while a single contact 16 and a single upper contact 20 are contained in the X direction. The contacts 16, 20 are disposed at a constant pitch in the X direction. A gate width UG1 in the basic unit U1 has a length of two pitches for disposition of the contacts in the X direction.

In the comparison pattern (2) shown in FIG. 6, by meandering the gate wiring 11a of the comparison pattern (1) (FIG. 5), the gate wiring 11B is produced. This structure intends to expand the gate width by meandering the gate wiring. The basic unit U2 includes a single pitch of meandering with a starting point of the meandering of the gate wiring 11B as a boundary and a pitch of the disposition of the gate wiring 11B in the Y direction. The gate width UG2 of the basic unit U2 is as long as a 1-pitch of the gate wiring 11B.

The gate wiring in the comparison pattern (3) of FIG. 7 is constructed in a grid structure with gate wirings 11C placed linearly in the X direction with a constant pitch in the Y direction and a gate wiring 12C placed linearly in the Y direction with a constant pitch in the X direction. This is a so-called mesh pattern. This structure intends to expand the gate width by forming gate wirings in the grid structure. The basic unit U3 contains the gate wirings 11C, 12C in its central portion, which are sectioned in the center of the gate wiring pitch of each in the X direction and Y direction. The gate width UG3 of the basic unit U3 is a sum of a length UG31 which is a 1-pitch length in the X direction minus the length of the intersecting portion of the gate wirings 11C and 12C and a length U32 which is a 1-pitch length in the Y direction minus the length of the intersecting region, while UG3=UG31+UG32.

Figure 8:
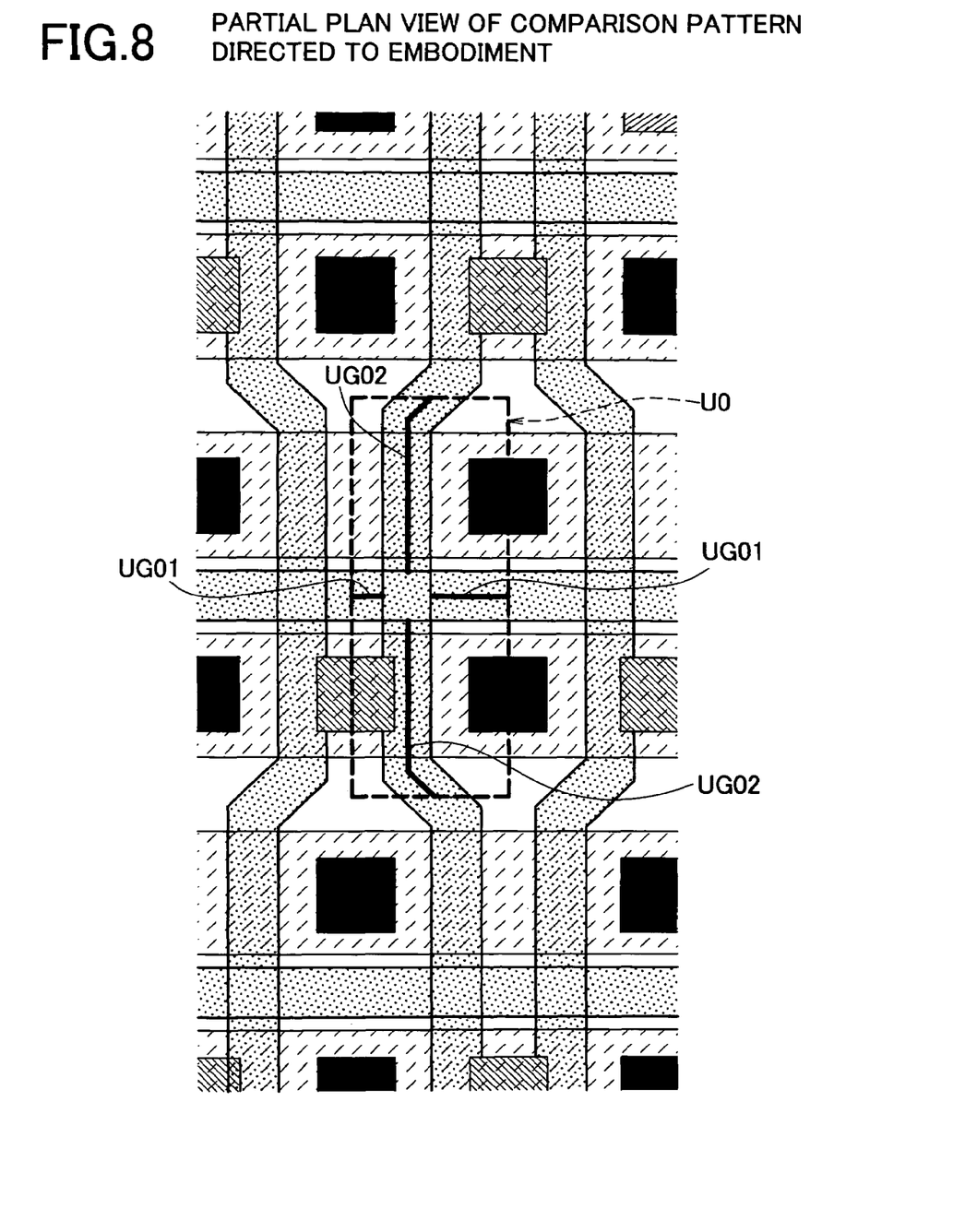
FIG. 8 is a partial plan view of comparison pattern directed to the embodiment.

FIG. 8 shows the basic unit U0 in the layout pattern of this embodiment. The basic unit U0 is a region which contains the gate wirings 11, 12 and sectioned by the center between the adjacent gate wirings in the X direction and the center of a bent portion 14 in the Y direction. The gate length UG0 of the basic unit U0 is a sum of a length UG01 which is a 1-pitch length in the X direction minus the length of the intersecting portion and a length UG02 which is a 1-pitch length in the Y direction minus the length of the intersecting region, while UG0=UG01+UG02.

Table 1 shows a result of comparison between the gate width ηx(x=0–3) and ON resistance RONx(x=0–3) per each unit area of the layout pattern (FIG. 1) of the embodiment and the comparison patterns (1)–(3). Here, the gate width ηxper unit area is a value calculated according to ηx=UGx/Sx with an area Sx (x=0–3) of the basic unit Ux (x=0–3) and a gate width UGx (x=0–3) of each basic unit. Table 1 shows a ratio of the gate width η1 per each unit area and ON resistance RON1 with the comparison pattern (1) adopted as a reference pattern.

TABLE 1

|  | pattern (1) (stripe) | pattern (2) (meandering) | pattern (3) (mesh) | embodiment |
|---|---|---|---|---|
| η ratio | 1 | 1.29 | 1.32 | 1.53 |
| RON ratio | 1 | 0.91 | 0.86 | 0.80 |

According to this embodiment, the η ratio is 1.5 times or more larger than the stripe type of the comparison pattern (1) and larger than the mesh type of the comparison pattern (3). Consequently, the gate width per unit area can be larger than other patterns. Further, the RON ratio is reduced by 20% as compared to the stripe type of the comparison pattern (1), so that it is smaller than the mesh type of the comparison pattern (3). Consequently, the ON resistance can be reduced with respect to the other patterns.

Here, the X direction and Y direction are an example about the first direction and the second direction, which corresponds to a case where the first and second directions intersects at right angle each other. In this case, the first predetermined pitch is pitch Y1 and the second predetermined pitch is pitch X1.

As described in detail above, according to the horizontal MOS transistor of this embodiment, when the second gate wiring 12 is wired in the Y direction at a pitch X1, the diffusion layer regions between the wirings are disposed with an excellent area efficiency such that the narrow-width region and the wide-width region repeats alternately. As for the Y direction, the diffusion layer regions opposing across the first gate wiring 11 are never deflected from each other with the same opposing side in width, so that they are disposed to oppose each other properly throughout that entire opposing side. Although the diffusion layer regions adjacent to the opposing diffusion layer region is constructed as a different electrode, there never occurs a case where the opposing side deflects so that the diffusion layer regions of the same pole oppose each other. Thus, there never occurs a case where the MOS transistor structure which does not operate as a transistor is formed, thereby making it possible to perform the transistor operation efficiently.

The wide-width regions disposed with two rows in the pitch Y1 are diffusion layer regions each having a different electrode and composed of the source layer and drain layer. The wiring layer which forms a bias route between the source layer and the drain layer is disposed linearly along the X direction, thereby forming an efficient layout.

Because the first gate wiring 11 is disposed linearly, the first gate wiring 11 can be wired with the shortest route in the X direction. In the wiring route of the first gate wiring 11 and the wiring route from the first gate wiring 11 up to the second gate wiring 12 branched in the Y direction, the gate resistance can be reduced.

Because the first gate wiring 11 and the second gate wiring 12 intersect each other at right angle, the intersecting area of the gate wirings can be reduced to a minimum area necessary. The structure portion which is composed of a diffusion layer region of the same pole located at the diagonal position, not contributing to the transistor operation, can be reduced to a minimum area necessary.

The MOS transistors are formed on four sides of the mesh structure constituted of the first gate wiring 11 and the second gate wiring 12, thereby increasing the gate width per each unit area. Because the region of the same electrode exists only in the diagonal direction and the gate wiring sandwiched therein is a minimum area necessary, the MOS transistor structure which is not related to the transistor operation can be reduced extremely. Further, because the second gate wiring 12 is disposed in the meandering condition in the Y direction, the gate width per each unit length in the Y direction can be expanded.

While the transistor structure not related to the transistor operation is minimized, the gate width of each unit area can be expanded. Consequently, the MOS transistor structure which executes an effective transistor operation in each unit region can be increased, and therefore, the horizontal MOS transistor having an excellent current drivability for each unit region and a small ON resistance can be constructed.

In the meanwhile, the present invention is not restricted to the above-described embodiment, and needless to say, the invention may be improved or modified in various ways within the scope not departing from the gist of the present invention.

Although this embodiment has been described by taking an example of the PMOS transistor in FIGS. 2–4, the present invention is not restricted to this example, but applicable to the NMOS transistor also.

Although for this embodiment, an example that the upper contact 20 which connects the wiring layer 18 to the upper wiring layer 28 is disposed in the narrow width region of the diffusion layer region at every pitch Y1, for some case, the upper contacts 20 may be disposed more dispersedly depending on the contact resistance and the like and for other case, it may be disposed more densely.

The present invention makes it possible to provide a horizontal MOS transistor capable of enhancing current drivability and reducing ON resistance by optimizing wiring structure of gate layer and layout structure of source-drain regions.

What is claimed is:

1. A horizontal MOS transistor comprising:
   first gate wirings arranged taking a first predetermined pitch in a second direction crossing a first direction, the first gate wirings being wired in the first direction; and
   second gate wirings being paired and arranged taking a second predetermined pitch pair by pair at wiring layer same as wiring layer of the first gate wirings, the second gate wirings being wired in the second direction,
   wherein the second gate wiring has a bend section at between adjoining two of the first gate wirings and meander by the first predetermined pitch.

2. A horizontal MOS transistor according to claim 1, wherein adjoining two of the second gate wirings meander in a mirror symmetry manner and the bend section is at substantially center of the second direction between adjoining two of the first gate wirings.

3. A horizontal MOS transistor according to claim 2, wherein a diffusion layer region surrounded by adjoining two of the first gate wirings and adjoining two of the second gate wirings is arranged such that,
   in the first direction, a pair of a narrow-width region and a wide-width region is arranged sandwiching the bend sections on the second direction and positioning of the pair of the narrow-width region and the wide-width region is reversed alternatingly, and
   in the second direction, either the narrow-width region or the wide-width region is arranged facing each other across a second gate wiring.

4. A horizontal MOS transistor according to claim 3, wherein the wide-width region has a contact which connects the diffusion layer region and wiring layer.

5. A horizontal MOS transistor according to claim 4, wherein the contact is arranged in two rows between adjoining two of the first gate wirings along the first direction, and the wiring layer is wired along the first gate wiring with encompassing the contact.

6. A horizontal MOS transistor according to claim 1, wherein the first gate wiring is wired linearly.

7. A horizontal MOS transistor according to claim 1, wherein the first gate wiring and the second gate wiring cross in orthogonal angle.

8. A horizontal MOS transistor according to claim 5, wherein two rows of the wiring layers wired along the first gate wiring are connected different terminals respectively in the horizontal MOS transistor.

9. A horizontal MOS transistor according to claim 8, wherein the diffusion layer region connected to two rows of the wiring layers correspond to drain layer and source layer for the horizontal MOS transistor.

10. A horizontal MOS transistor according to claim 5, wherein two rows of the wiring layers wired along the first gate wiring are connected different terminals respectively in the horizontal MOS transistor, and the narrow-width region has two kinds of upper contacts which connect each of the wiring layers and two sets of upper wiring layers common to each of the wiring layers.

11. A horizontal MOS transistor according to claim 10, wherein the two kinds of upper contacts connect every other wiring layer of the two rows of wiring layers and different two sets of upper wiring layers.

12. A horizontal MOS transistor according to claim 10, wherein the two sets of upper wiring layers are wired crossing the wiring layers.

13. A horizontal MOS transistor according to claim 12, wherein the two sets of upper wiring layers are wired extending in the second direction.

14. A horizontal MOS transistor according to claim 10, wherein the two sets of upper wiring layers are arranged in planner state crossing the wiring layers.

15. A horizontal MOS transistor according to claim 10, wherein the horizontal MOS transistor constitutes a power transistor.

16. A horizontal MOS transistor according to claim 1, wherein the horizontal MOS transistor is built in a semiconductor integrated circuit device for power control.

17. A horizontal MOS transistor according to claim 10, wherein the power control includes control of switching power supply.

18. A horizontal MOS transistor according to claim 1, wherein the horizontal MOS transistor is used as an output stage transistor.

19. A semiconductor device for power control having a MOS transistor, the MOS transistor comprising:
   first gate wirings arranged taking a first predetermined pitch in a second direction crossing a first direction, the first gate wirings being wired in the first direction; and
   second gate wirings being paired and arranged taking a second predetermined pitch pair by pair at wiring layer same as wiring layer of the first gate wirings, the second gate wirings being wired in the second direction, wherein the second gate wiring has a bend section at between adjoining two of the first gate wirings and meander by the first predetermined pitch.

20. A semiconductor device for power supply having a MOS transistor, the MOS transistor comprising:

first gate wirings arranged taking a first predetermined pitch in a second direction crossing a first direction, the first gate wirings being wired in the first direction; and second gate wirings being paired and arranged taking a second predetermined pitch pair by pair at wiring layer same as wiring layer of the first gate wirings, the second gate wirings being wired in the second direction, wherein the second gate wiring has a bend section at between adjoining two of the first gate wirings and meander by the first predetermined pitch.

* * * * *